US009165627B2

(12) United States Patent
Liu et al.

(10) Patent No.: US 9,165,627 B2
(45) Date of Patent: *Oct. 20, 2015

(54) SPIN TORQUE TRANSFER MEMORY CELL STRUCTURES AND METHODS

(71) Applicant: Micron Technology, Inc., Boise, ID (US)

(72) Inventors: Jun Liu, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

This patent is subject to a terminal disclaimer.

(21) Appl. No.: 13/926,397

(22) Filed: Jun. 25, 2013

(65) Prior Publication Data
US 2013/0286727 A1   Oct. 31, 2013

Related U.S. Application Data

(62) Division of application No. 13/108,385, filed on May 16, 2011, now Pat. No. 8,472,240.

(51) Int. Cl.
| G11C 11/00 | (2006.01) |
| G11C 11/16 | (2006.01) |
| H01L 43/08 | (2006.01) |
| H01L 29/66 | (2006.01) |
| H01L 43/02 | (2006.01) |

(52) U.S. Cl.
CPC ............. *G11C 11/16* (2013.01); *G11C 11/161* (2013.01); *H01L 29/66984* (2013.01); *H01L 43/02* (2013.01); *H01L 43/08* (2013.01)

(58) Field of Classification Search
USPC ......... 365/48, 55, 62, 66, 74, 78, 80–93, 100, 365/130, 131, 148, 158, 171–173, 225.5, 365/243.5; 257/421, E21.665; 438/3; 977/933–935
See application file for complete search history.

(56) References Cited

U.S. PATENT DOCUMENTS

| 6,925,000 B2 | 8/2005 | Sussner |
| 7,122,854 B2 | 10/2006 | Fukuzumi |
| 7,129,555 B2 | 10/2006 | Nozieres et al. |
| 7,411,817 B2 | 8/2008 | Nozieres et al. |
| 7,508,041 B2 | 3/2009 | Noh et al. |

(Continued)

FOREIGN PATENT DOCUMENTS

| EP | 2249350 A1 | 11/2010 |
| JP | H11353867 A | 12/1999 |

(Continued)

OTHER PUBLICATIONS

Decision on Rejection from Taiwan patent application No. 101116991, dated Nov. 28, 2014, 14 pp.

(Continued)

*Primary Examiner* — Harry W Byrne
(74) *Attorney, Agent, or Firm* — Brooks, Cameron & Huebsch, PLLC

(57) ABSTRACT

Spin Torque Transfer (STT) memory cell structures and methods are described herein. One or more STT memory cell structures comprise an annular STT stack including a nonmagnetic material between a first ferromagnetic material and a second ferromagnetic material and a soft magnetic material surrounding at least a portion of the annular STT stack.

19 Claims, 4 Drawing Sheets

(56) References Cited

U.S. PATENT DOCUMENTS

| | | | |
|---|---|---|---|
| 8,043,732 B2 * | 10/2011 | Anderson et al. | 428/811.1 |
| 8,357,982 B2 | 1/2013 | Kajiyama | |
| 2007/0030728 A1 | 2/2007 | Kent et al. | |
| 2008/0165454 A1 | 7/2008 | Kajiyama | |
| 2009/0246557 A1 | 10/2009 | Horng et al. | |
| 2009/0290413 A1 | 11/2009 | Prejbeanu | |
| 2010/0109061 A1 | 5/2010 | Kushida | |
| 2010/0109108 A1 | 5/2010 | Zheng et al. | |
| 2010/0110783 A1 | 5/2010 | Liu et al. | |
| 2010/0117169 A1 * | 5/2010 | Anderson et al. | 257/421 |
| 2011/0014500 A1 | 1/2011 | Horng et al. | |

FOREIGN PATENT DOCUMENTS

| | | |
|---|---|---|
| JP | 2004349671 A | 12/2004 |
| JP | 2005340715 A | 12/2005 |
| JP | 2006060236 A | 3/2006 |
| JP | 2008159613 A | 7/2008 |
| JP | 2011204768 A | 10/2011 |
| WO | 2011005484 A2 | 1/2011 |

OTHER PUBLICATIONS

Search Report from related Taiwanese patent application No. 101116991, dated May 26, 2014, 15 pp.

Kent, A.D., et al. "Annular Spin-Transfer Memory Element." IEEE, Jan. 2009. (6 pages).

Moneck, Matthew T., et al. "Spin Transfer Torque in Deep Submicron Annular CPP-GMR Devices." IEEE Transactions on Magnetics, Nov. 2008 (pp. 2500-2503) vol. 44, Issue 11.

Fix T., et al., "Coupling Between Ferromagnetic Electrodes Through ZnS Barrier," Journal of Magnetism and Magnetic Materials, Feb. 2005, vol. 286, pp. 134-137.

International Search Report and Written Opinion for related PCT Application No. PCT/US2012/036083, mailed Oct. 30, 2012, (11 pgs.).

Office Action from related Japanese patent application No. 2014-511383, dated Dec. 2, 2014, 5 pp.

Extended European Search Report from European application No. 12785834.8, dated Oct. 21, 2014, 5 pp.

Notice of Reasons for Rejection from related Korean patent application No. 10-2013-7032456, dated Apr. 29, 2015, 11 pp.

* cited by examiner

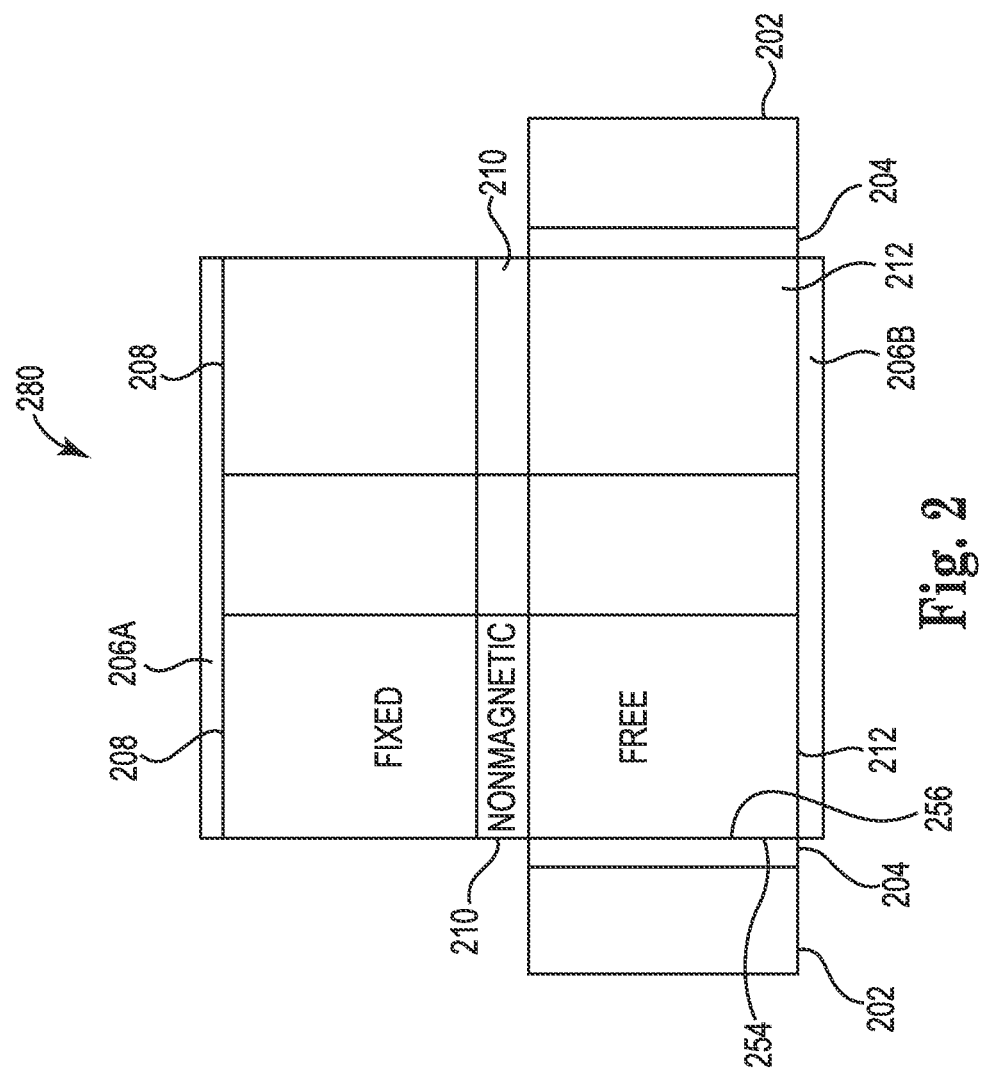

SPIN TORQUE TRANSFER MEMORY CELL STRUCTURES AND METHODS

PRIORITY APPLICATION INFORMATION

This application is a Divisional of U.S. application Ser. No. 13/108,385, filed May 16, 2011, to be issued as U.S. Pat. No. 8,472,240 on Jun. 25, 2013, the specification of which is incorporated herein by reference.

TECHNICAL FIELD

The present disclosure relates generally to semiconductor memory devices and methods, and more particularly, to spin torque transfer (STT) memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

MRAM devices can employ a magnetic tunneling junction (MTJ) that can be viewed as a multi-state resistor due to different relative orientations (e.g., parallel and antiparallel) of the magnetic moments, which can change the magnitude of a current passing through the device. In a write process, magnetic fields caused by currents passing through conductive lines can be used to switch a magnetic moment direction of a "free" material of the MTJ, which can place the device in a high or low resistance state. A read process can then be used to determine the state of cell.

MRAM devices can also employ structures exhibiting giant magnetoresistance (GMR), such as spin valves. GMR can be observed in thin film structures composed of alternating ferromagnetic and nonmagnetic material. GMR can result in a change in electrical resistance depending on whether the magnetization of adjacent ferromagnetic materials is in a parallel or an anti-parallel alignment. A spin valve can alternate its electrical resistance (e.g., from high to low or from low to high) depending on the alignment of two or more conducting magnetic materials, in order to exploit the giant magnetoresistive effect.

As the size of MRAM cells decreases, the distance between adjacent cells also decreases, which can result in increased cell disturb caused by the current carrying lines used to switch the magnetic moment directions. As an example, the write current associated with a MRAM device can be about 10 mA, which can be problematic as the size of the MRAM cells and current carrying lines decreases. For instance, the smaller width lines can require greater currents to produce the necessary switching fields, which increases power consumption.

STT devices share some of the operational features of previous MTJ and GMR cells; however, switching of the free material magnetic moment (e.g., the write process) can be produced by passage of the spin polarized current itself. For instance, unpolarized conduction electrons passing through a first magnetic material having its magnetic moment oriented in a given direction (e.g. a "fixed" material) are preferentially polarized by their passage through that material by a quantum mechanical exchange interaction with the polarized bound electrons in the material. Such a polarization can occur to conduction electrons that reflect from the surface of the magnetized material as well as to those that pass through it. The efficiency of such a polarization process can depend upon the crystalline structure of the material. When such a stream of polarized conduction electrons subsequently pass through a second magnetic material (e.g., the "free" material) whose polarization direction is not fixed in space, the polarized conduction electrons exert a torque on the bound electrons in the magnetic materials which, if sufficient, can reverse the polarization of the bound electrons and, thereby, reverse the magnetic moment of the magnetic material.

The use of a current internal to the cell to cause the magnetic moment reversal provides for smaller currents (e.g., about 200 microamps) than those required to produce an external magnetic field (e.g., from adjacent current carrying lines) to produce the moment switching. However, further reduction in the current used to produce magnetic moment switching in STT RAM cells can provide benefits such as further reducing the energy consumption and thermal profile in the materials associated with such cells, which can improve cell integrity and reliability, among other benefits.

BRIEF DESCRIPTION OF THE DRAWINGS

FIG. 2 illustrates a cross-sectional view of an STT memory cell structure in accordance with one or more embodiments of the present disclosure.

DETAILED DESCRIPTION

Figure 1A:
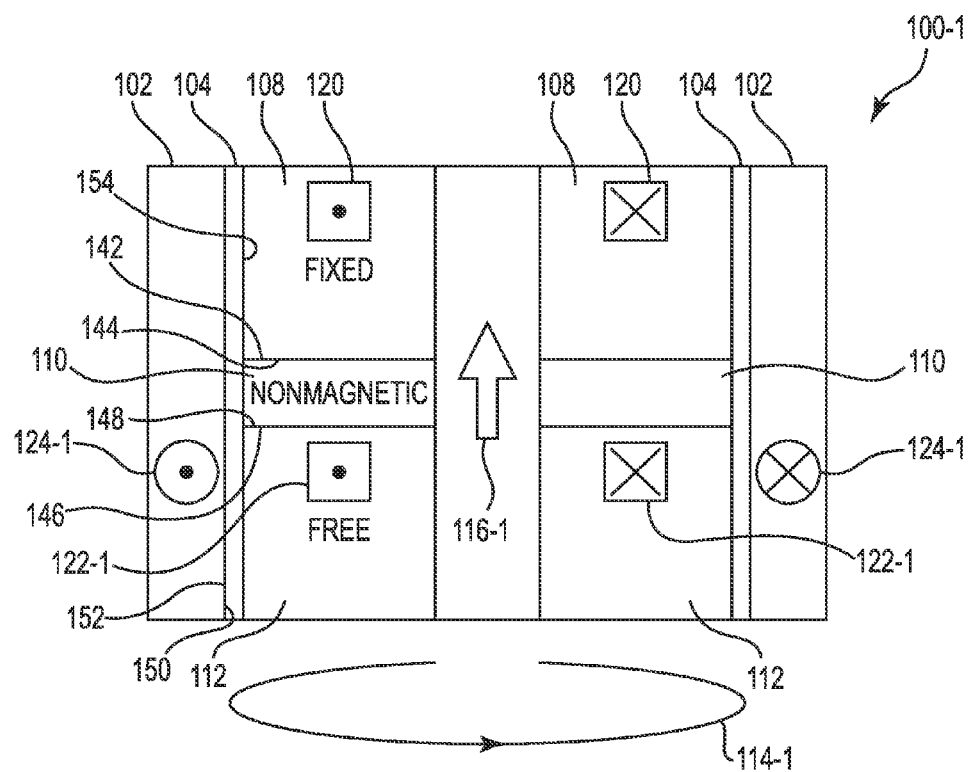
FIGS. 1A-1B illustrates cross-sectional views of an STT memory cell structure in accordance with one or more embodiments of the present disclosure.

Spin Torque Transfer (STT) memory cell structures and methods are described herein. One or more STT memory cell structures comprise an annular STT stack including a non-magnetic material between a first ferromagnetic material and a second ferromagnetic material and a soft magnetic material surrounding at least a portion of the annular STT stack.

Embodiments of the present disclosure can provide benefits such as a reduction in cross-talk among neighboring cells arising from a current-induced magnetic field (e.g., a transient Oersted field). Embodiments can also provide for a reduced programming current as compared to previous STT memory cells with little or no effect on a memory cell's thermal stability. For instance, in one or more embodiments, the transient Oersted field associated with a programming current through the cell can be used to induce a transient ferromagnetic coupling within the cell, which can reduce the critical switching current associated with the cell.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1B:
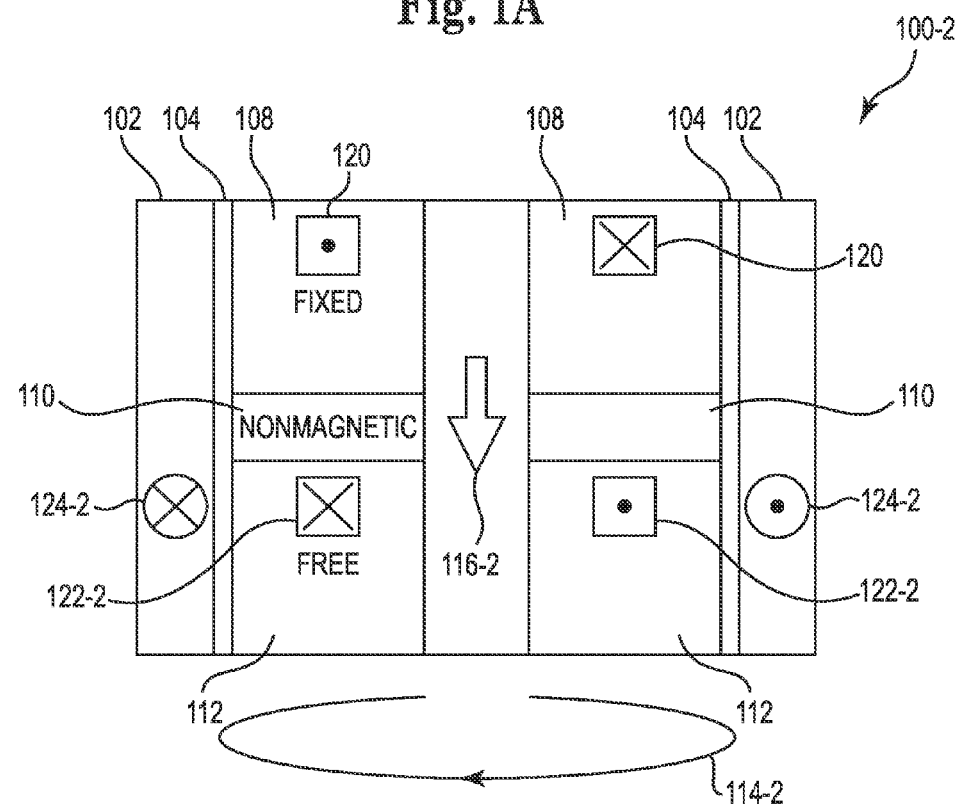

FIGS. 1A-1B illustrates cross-sectional views of an STT memory cell structure in accordance with one or more embodiments of the present disclosure. The cross-sectional views 100-1 and 100-2 of FIGS. 1A and 1B illustrate an annular STT memory cell that can be positioned between a first electrode and a second electrode (not pictured). The electrodes can be biased with suitable voltages in order to program, read, and/or erase the memory cells. For instance, cross-sectional view 100-1 illustrates the annular STT memory cell structure under the influence of a programming current (e.g., 116-1) in a particular direction, while cross-sectional view 100-2 illustrates the annular STT memory cell structure under the influence of a programming current (e.g., 116-2) in the opposite direction.

Memory cell structures 100-1 and 100-2 can include a first magnetic material 112 and a second magnetic material 108. In one or more embodiments, the first magnetic material can be a "free" ferromagnetic material 112 and the second magnetic material can be a "fixed" ferromagnetic material 108, however, embodiments are not so limited. Between the first and second magnetic materials 112 and 108 is nonmagnetic material 110 that can be an insulating material or a conductive material. Annular memory cell structures such as those illustrated in FIGS. 1A and 1B can form a fully closed, magnetic flux path with no edge demagnetization which can result in increased thermal stability compared with a conventional (e.g., non-annular) cell stack.

As illustrated in FIGS. 1A-1B, the annular memory cell structures are configured such that a first edge portion 142 of the fixed material 108 is in contact with a first edge portion 144 of the nonmagnetic material 110, and a first edge portion 146 of the free material 112 is in contact with a second edge portion 148 of the nonmagnetic material 110. As illustrated in FIGS. 1A-1B, each of the fixed material 108, the nonmagnetic material 110, and the free material 112 can be in contact with an inner edge 154 of a coupling material 104. Coupling material 104 can have an outer edge 150 in contact with an inner edge 152 of a third, or "soft" magnetic material 102.

Nonmagnetic material 110 can be a nonmagnetic metal (e.g., copper), or a dielectric material (e.g., aluminum oxide). For instance, in one or more embodiments, the STT structure illustrated in FIGS. 1A and 1B can include a spin valve structure and/or other structures exhibiting GMR. In such embodiments, The free material 112 and the fixed material 108 can be separated by a nonmagnetic metal 110. GMR can result in a change in electrical resistance depending on whether the magnetization of adjacent ferromagnetic materials (e.g., 112 and 108) is in a parallel alignment (e.g., 120 and 122-1 as shown in FIG. 1A) or an anti-parallel alignment (e.g., 120 and 122-2 as shown in FIG. 1B). The overall resistance can be lower for parallel alignment and higher for anti-parallel alignment. As such, memory cell structure 100-1 can represent a low resistance state and memory cell structure 100-2 can represent a high resistance state.

In one or more embodiments, the STT structure shown in FIGS. 1A and 1B can include a magnetic tunnel junction (MTJ). In such embodiments, the free ferromagnetic material 112 and the fixed ferromagnetic material 108 can be separated by a dielectric material 110, through which electrons can tunnel. The magnetization direction 122-1/122-2 of the free ferromagnetic material 108 can be switched via a spin torque transfer effect produced by the spin-polarized programming current 116-1/116-2.

The third magnetic material 102 can be a "soft" magnetic material and can encapsulate the cell structures 100-1 and 100-2. Soft magnetic material 102 has a high magnetic permeability, which can result in a magnetic field generated by a programming current to be confined within the soft magnetic material 102 with little or no field leakage.

Soft magnetic material 102 can have a high magnetic permeability (e.g., greater than about 500 $Hm^{-1}$), and it can include a silicon-doped iron material, a nickel-iron-copper-molybdenum alloy material, a manganese-zinc ferrite, a nickel-zinc ferrite, a cobalt-based amorphous metal, and/or an iron-based amorphous metal. Soft magnetic material can further include alloy materials, such as a cobalt-iron alloy material, a nickel-iron alloy material, a nickel-iron-copper-chromium alloy material and/or a cobalt-zirconium-palladium-manganese alloy material. Soft magnetic material 102 can also include a metal ferrite, wherein the metal can include manganese, iron, cobalt, nickel, copper, zinc, magnesium and/or cadmium. Soft magnetic material 102 can further include an iron metal nitride, wherein the metal can include aluminum, tantalum, rhodium, molybdenum, silicon, and/or zirconium. Soft magnetic material 102 is not limited to the aforementioned materials and can also include a Mu-metal material, a permalloy material, a ferrite material, and/or an electrical steel material.

Arrows 116-1 and 116-2 indicate the direction of a current (e.g., a programming current) provided to memory cell structures 100-1 and 100-2, respectively. Programming currents can vary depending, for instance, on the size of a memory cell structure, and can be from about 20 to about 1,000,000 micro Amps. Programming current illustrated as flowing in a particular direction can represent electron current flowing in the opposite direction. For example, in memory cell structure 100-1, the programming current is shown flowing in an upward direction (e.g., from free material 112 toward fixed material 108), meaning the electron current is flowing in a downward direction (e.g., from fixed material 108 toward free material 112). Arrow 114-1 indicates the annular magnetic field resulting from the programming current 116-1. Arrow 114-2 indicates the annular magnetic field resulting from the programming current 116-2. As such, the magnetic fields 114-1 and 114-2 may be referred to as Oersted fields. Symbol 120 indicates the annular magnetization associated with the fixed magnetic material 108 of structures 100-1 and 100-2. Symbol 124-1 indicates the magnetic field direction within soft magnetic material 102 of structure 100-1. Symbol 124-2 indicates the magnetic field direction within soft magnetic material 102 of structure 100-2.

Symbol 122-1 indicates the annular magnetization associated with the free magnetic material 112 (e.g., due to programming current 116-1). Symbol 122-2 indicates the annular magnetization associated with the ferromagnetic material 112 due to a programming current in the opposite direction (e.g., current 116-2). In operation, the programming currents 116-1 and 116-2 can be used to switch the magnetization of the free ferromagnetic material 112 between a clockwise and counter clockwise orientation. As described further herein, one or more embodiments of the present disclosure can reduce the magnitude of the programming current (e.g., 116-1 and 116-2) needed to switch the magnetization direction within free ferromagnetic material 112 (e.g., from direction 122-1 to 122-2 or vice versa).

The resistance of an STT memory cell structure depends on the relative magnetization directions of the free magnetic material 112 and the fixed magnetic material 108 (e.g., parallel or anti-parallel). A programming current can be provided to switch the annular magnetization of the free magnetic material 112 between a first resistance state (e.g., corresponding to a parallel orientation as shown in FIG. 1A) and an anti-parallel orientation as shown in FIG. 1B). Specifically, a spin torque transfer effect between a spin polarized injected programming current and the magnetization of the free ferromagnetic material 112 can be used to switch the magnetization direction of an STT memory cell device from one vortex state to the opposite state. A read current having a smaller magnitude than the programming current can be applied to the cell in order to determine the resistance state of the cell, which depends on the relative magnetization of the free ferromagnetic material 112 and the fixed ferromagnetic material 108. In annular STT memory cell structures such as those shown in FIGS. 1A and 1B, the Oersted field 114-1/114-2 associated with programming current 116-1/116-2 can assist in switching the magnetization direction of free ferromagnetic material 112, which can reduce the current magnitude required for switching as compared to non-annular STT memory cell structures. However, the annular Oersted filed 114-1/114-2 may not be locally confined to a particular STT cell. As such, the Oersted field 114-1/114-2 can create crosstalk issues with adjacent cells, for instance.

The memory cell structure illustrated in FIGS. 1A and 1B includes coupling material 104 and soft magnetic material 102 surrounding at least a portion of free material 112. Coupling material 104 is a material used to induce parallel ferromagnetic coupling between the soft magnetic material 102 and the free ferromagnetic material 112. The coupling material 104 can include, for instance, at least one of chromium (III) oxide ($Cr_2O_3$), zinc sulfide (ZnS), zinc selenide (ZnSe), boron nitride (BN), aluminum oxide ($Al_2O_3$), and magnesium oxide (MgO) and can also have a thickness suitable to induce parallel coupling between the free material 112 and the magnetized soft magnetic material 102.

In operation, the Oersted field 114-1/114-2 generated by the programming current 116-1/116-2 can magnetize the soft magnetic material 102 (e.g., as illustrated by magnetization 124-1 and 124-2). Coupling material 104 induces parallel ferromagnetic coupling between the magnetized soft magnetic material 102 and the free material 112 which facilitates the switching of the free material 112. As such, the parallel coupling between the soft magnetic material 102 and the free ferromagnetic material 112 provides a contribution to switching of the magnetization 122-1/122-2 due to the spin-torque-transfer effect of spin-polarized electrons and the field 114-1/114-2 associated with the programming current 116-1/116-2. For example, the torque exerted on the free ferromagnetic material 112 (due to the ferromagnetic coupling with the soft magnetic material 102 induced via the coupling material 104) can reduce a spin current torque required for switching. When the programming current is removed, the soft magnetic material 102 can lose its magnetization or retain a smaller magnetization, which is parallel to the magnetization 122-1/122-2 of the free material 112 (due to the ferromagnetic coupling induced by coupling material 104). The soft magnetic material 102 can also help to fortify a thermal stability of the free material 112.

As such, one or more memory cell structures, such as those illustrated in FIGS. 1A and 1B can facilitate programming an STT memory cell with a decreased current while retaining or enhancing a thermal stability needed for data retention. The soft magnetic encapsulation material 102 can also confine at least a portion of the Oersted field 114-1/114-2 locally to the STT cell, which can decrease disturb to adjacent memory cells. Soft magnetic material 102 has a high magnetic permeability, which can result in a magnetic field generated by a programming current to be confined within the soft magnetic material 102 with little or no field leakage. In one or more embodiments, memory cell structures 100-1 and 100-2 can be formed without coupling material 104. That is, soft magnetic encapsulation material 102 can confine at least a portion of a current-induced magnetic field (e.g., 114-1/114-2) without the presence of coupling material 104.

As illustrated in FIGS. 1A-1B, soft magnetic material 102 surrounds (e.g., encapsulates) the entire annular cell stack including fixed material 108, nonmagnetic material 110, and free material 112. However, embodiments are not limited to the example shown in FIGS. 1A and 1B. For instance, in one or more embodiments, the soft magnetic material 102 encapsulates only the free ferromagnetic material 112 or a portion thereof. Coupling material 104 can be present in memory cell structures 100-1 and 100-2 along the entire cell, as illustrated in FIGS. 1A-1B (e.g., from fixed material 108 to free material 112), or coupling material 104 can be confined to an area between free material 112 and soft material 102 (e.g., coupling material 104 is not in contact with fixed material 108 or nonmagnetic material 110).

The example illustrated in FIG. 1A illustrates a programming current 116-1 flowing from free material 112 to fixed material 108 of an STT memory cell. The current 116-1 generates an Oersted field 114-1, which induces an annular magnetization (e.g., counter clockwise) in the soft magnetic material 102. As described above, the soft magnetic material 102 can confine the field 114-1 locally to the cell.

Spin-torque associated with downward electron flow (e.g., opposite direction 116-1) can contribute to counter clockwise magnetization 122-1 in the free magnetic material 112. Ferromagnetic coupling induced between the soft magnetic material 102 and free material 112 via the coupling material 104 can also create a torque contributing to the a counter clockwise magnetization 122-1 in the free material 112. The parallel alignment of the magnetizations 120 and 122-1 can result in the memory cell structure having a low resistance state. The torque created due to the ferromagnetic coupling between the soft magnetic material 102 and the free ferromagnetic material 112 can reduce the amount of spin-torque associated with the downward electron flow needed to induce switching of the magnetization of the ferromagnetic material 112 (e.g., from anti-parallel to parallel).

The example illustrated in FIG. 1B shows a programming current 116-2 flowing down (e.g., opposite to direction 116-1). As such, spin polarized electrons associated with current 116-2 flow up (e.g., from free material 112 toward fixed material 108) and exert torque on the free ferromagnetic material 112, which can result in the clockwise magnetization in the free magnetic material 112. Ferromagnetic coupling induced between the soft magnetic material 102 and free material 112 via the coupling material 104 can also create a torque contributing to the clockwise magnetization 122-2 in the free material 112. The anti-parallel alignment of the magnetizations 120 and 122-2 can result in the memory cell structure having a high resistance state. As described above, the torque created due to the ferromagnetic coupling between the soft magnetic material 102 and the free ferromagnetic material 112 can assist with switching the magnetization of ferromagnetic material 112 (e.g., from parallel to anti-parallel).

Figure 1C:
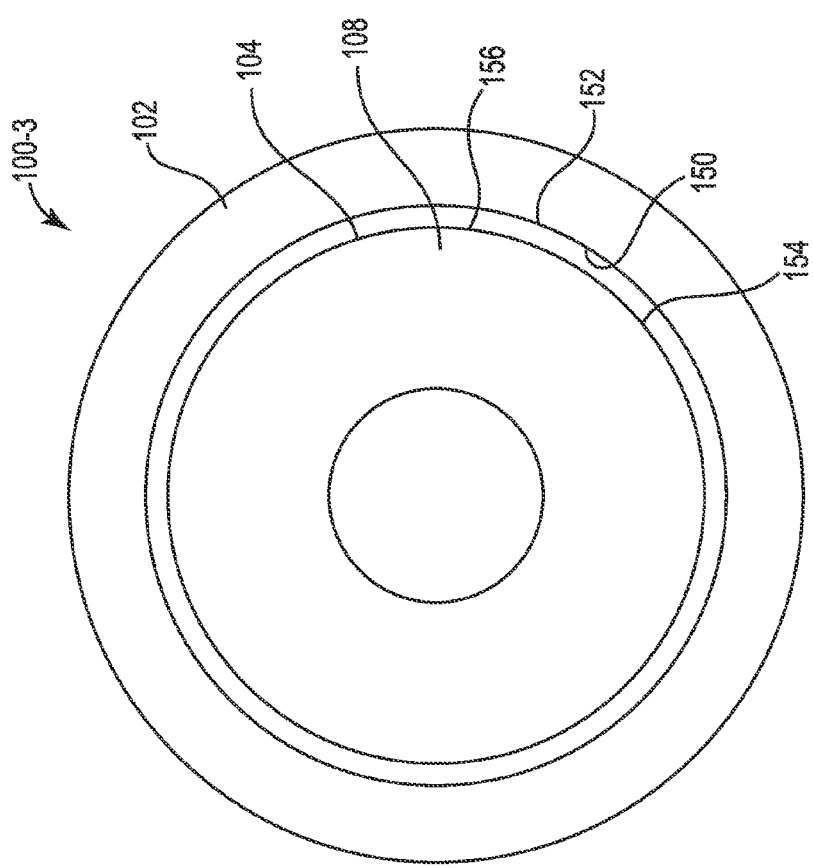
FIG. 1C illustrates a top-down view of the STT memory cell structure illustrated in FIGS. 1A and 1B.

FIG. 1C illustrates a top-down view of the STT memory cell structure illustrated in FIGS. 1A and 1B. Embodiments are not limited to the example illustrated in FIG. 1C. For instance, in one or more embodiments, the materials 102, 104, and 108 may not span an entire circumference of the cell. Also, although the materials 102, 104, and 108 are shown having a circular geometry, embodiments are not so limited.

As illustrated in FIG. 1C, the memory cell structure 100-3 is configured such that an inner edge portion 152 of the soft magnetic material 102 is in contact with an outer edge portion 150 of the coupling material 104. In some embodiments, coupling material 104 may not be present, and as a result, an inner edge 152 of soft magnetic material 102 may be in contact with an outer edge 156 of a fixed material 108 or free ferromagnetic material 112 (not shown in FIG. 1C). As further illustrated in FIG. 1C, the memory cell structure is configured such that an inner edge portion 154 of the coupling material 104 is in contact with an outer edge portion 156 of material 108.

FIG. 2 illustrates a cross-sectional view of an STT memory cell structure 280 in accordance with one or more embodiments of the present disclosure. Memory cell structure 280 is an annular STT memory cell structure and can include soft magnetic material 202, coupling material 204, a first electrode 206A and a second electrode 206B. Memory cell structure 280 can also include fixed magnetic material 208, nonmagnetic material 210, and free magnetic material 212, which is surrounded, at least in part, by coupling material 204 and soft magnetic material 202. Coupling material 204 can be formed between the free material 212 and the soft material 202 such that the inner surface 254 of the coupling material 204 is in contact with at least a portion of the outer surface 256 of the free material 212.

Memory cell structure 280 can also result in a reduction in a programming current requirement as a result of free ferromagnetic material 218 being separated from soft magnetic encapsulation material 202 by ferromagnetic coupling material 204. Ferromagnetic coupling between the soft material 202 and the free material 218 can facilitate the switching of the free material, which can reduce a programming current requirement (e.g., a critical switching current) and fortify the thermal stability of the free material 218.

Embodiments are not limited to the example illustrated in FIG. 2. In some instances, the memory cell structure 280 may be sufficient to reduce required programming current without the coupling material 204. In some embodiments, soft material 202 can be etched using various processes (e.g., dry or wet etching).

Figure 3:
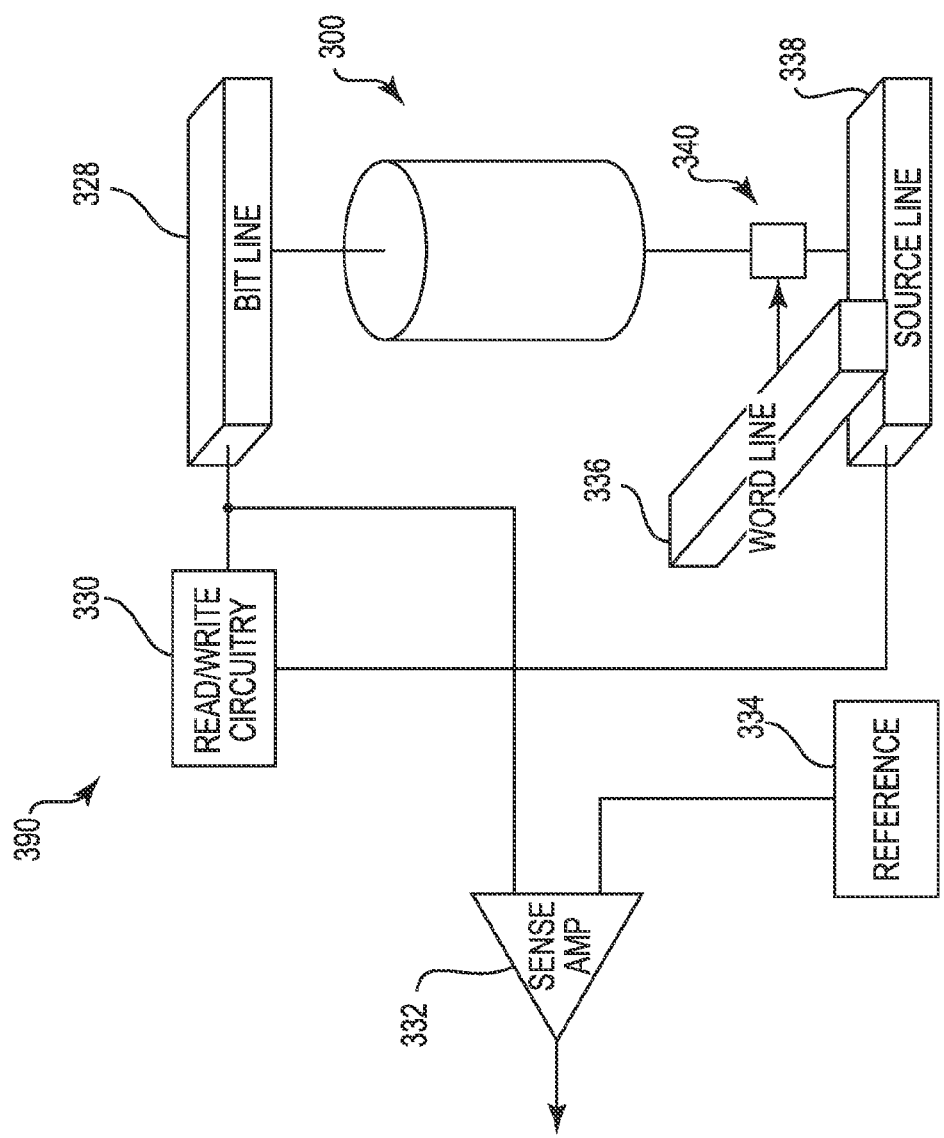
FIG. 3 illustrates a portion of a memory array having one or more STT memory cell structures in accordance with one or more embodiments of the present disclosure.

FIG. 3 illustrates a portion of a memory array 390 having one or more STT memory cell structures in accordance with one or more embodiments of the present disclosure. An STT RAM cell can include an STT memory cell structure 300 (e.g., such as the STT structures described above in connection with FIGS. 1A-1C and 2) coupled to an access device 340. For example, access device 340 can be a diode, a field effect transistor (FET), or bipolar junction transistor (BJT).

In this example, the array 390 includes a bit line 328, a word line 336, a source line 338, read/write circuitry 330, a bit line reference 334, and a sense amplifier 332. The STT memory cell structure 300 can include one or more MTJ or GMR elements. As described above, the STT memory cell structure 300 can include an annular STT stack including a nonmagnetic material between a fixed ferromagnetic material and a free ferromagnetic magnetic material. At least a portion of the annular STT stack can be encapsulated by a soft magnetic material (e.g., soft magnetic material 102 shown in FIGS. 1A-1C). One or more embodiments include a coupling material (e.g., coupling material 104 shown in FIGS. 1A and 1B) between the soft magnetic material and at least a portion of the free ferromagnetic material.

In operation, the STT memory cell structure 300 can be selected to be programmed. Programming current can be provided via voltage differences applied across electrodes corresponding to structure 300. The Oersted field associated with the programming current can induce annular magnetization (e.g., in the same direction as the Oersted field) in the soft magnetic material of the structure 300. Parallel ferromagnetic coupling can be induced between the soft magnetic material and the free ferromagnetic material via the coupling material. The induced ferromagnetic coupling can exert a torque on the magnetization of the free ferromagnetic material, which can reduce the programming current required to induce switching.

When the programming current is removed, the soft magnetic material may lose its magnetization or may retain a small magnetization which is parallel to the free ferromagnetic material as a result of the ferromagnetic coupling. The soft magnetic materials can serve to confine the Oersted field associated with the programming current locally to the cell and can also help to fortify thermal stability in the free ferromagnetic material.

To read the STT RAM cell, the read/write circuitry 330 generates a read current to the bit line 328 and the source line 338 through the structure 300 and the access device 340. The programmed state of the STT RAM cell depends on the resistance across the structure 300, which may be determined by the voltage difference between the bit line 328 and the source line 338. In one or more embodiments, the voltage difference may be compared to a reference 334 and amplified by a sense amplifier 332. Embodiments are not limited to the example illustrated in FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A spin torque transfer (STT) memory cell structure, comprising:
   an annular STT stack including a nonmagnetic material between a first ferromagnetic material and a second ferromagnetic material; and
   a soft magnetic material surrounding at least a portion of the annular STT stack.

2. The memory cell structure of claim 1, wherein the first ferromagnetic material is a free ferromagnetic material and the second ferromagnetic material is a fixed ferromagnetic material.

3. The memory cell structure of claim 2, wherein the ferromagnetic coupling material is configured to induce parallel coupling between the free ferromagnetic material and the soft magnetic material.

4. The memory cell structure of claim 1, wherein the annular STT stack is formed between a first electrode and a second electrode.

5. The memory cell structure of claim 1, wherein the soft magnetic material is induced with a magnetization that affects a magnetization of the first ferromagnetic material via the ferromagnetic coupling material.

6. The memory cell structure of claim 1, wherein the ferromagnetic coupling material provides transient, parallel ferromagnetic coupling between the first ferromagnetic material and the soft magnetic material.

7. A method of forming an STT memory cell structure, comprising:
   forming an annular STT stack including a nonmagnetic material between a first ferromagnetic material and a second ferromagnetic material; and
   forming a soft magnetic material surrounding at least a portion of the annular STT stack.

8. The method of claim 7, including forming a ferromagnetic coupling material between the soft magnetic material and the first ferromagnetic material.

9. The method of claim 8, wherein forming the ferromagnetic coupling material includes forming the ferromagnetic coupling material such that the ferromagnetic coupling material provides transient, parallel ferromagnetic coupling between the first ferromagnetic material and the soft magnetic material.

10. The method of claim 7, wherein forming the soft magnetic material includes forming the soft magnetic material such that the soft magnetic material encapsulates an entire outer surface of the first ferromagnetic material.

11. The method of claim 7, wherein forming the soft magnetic material includes forming the soft magnetic material such that the soft magnetic material confines at least a portion of a magnetic field generated by a current associated with operating the STT memory cell structure.

12. The method of claim 7, including forming a coupling material between the annular stack and the soft magnetic material such that the inner surface of the coupling material is in contact with at least a portion of the outer surface of the first ferromagnetic material.

13. The method of claim 8, wherein forming the soft magnetic material includes forming the soft magnetic material such that it encapsulates an entire outer surface of the ferromagnetic coupling material.

14. A method of operating an STT memory cell, comprising:
   providing a current through an annular STT stack between a first electrode and a second electrode, the annular STT stack including:
      a nonmagnetic material between a free ferromagnetic material and a fixed ferromagnetic material; and
      a soft magnetic material surrounding at least a portion of the annular STT stack.

15. The method of claim 14, wherein the current induces an annular magnetization in the soft magnetic material surrounding at least a portion of the free ferromagnetic material.

16. The method of claim 15, wherein the induced annular magnetization alters a magnetization of the free ferromagnetic material via a ferromagnetic coupling material between the soft magnetic material and the free ferromagnetic material.

17. The method of claim 15, wherein the annular magnetization of the soft magnetic material exerts a force on the free ferromagnetic material.

18. The method of claim 14, including reducing a critical switching current associated with the STT memory cell.

19. The method of claim 14, wherein providing the current includes providing a programming current.

* * * * *